United States Patent
Elfadel et al.

(10) Patent No.: US 7,496,485 B2
(45) Date of Patent: Feb. 24, 2009

(54) METHODS AND APPARATUS FOR PREDICTING CONVERGENCE OF A TRANSVERSAL WAVEFORM RELAXATION ALGORITHM

(75) Inventors: Ibrahim M. Elfadel, Ossining, NY (US); Hao Ming Huang, Katonah, NY (US); Albert E. Ruehli, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 11/356,637

(22) Filed: Feb. 17, 2006

(65) Prior Publication Data
US 2007/0198233 A1   Aug. 23, 2007

(51) Int. Cl.
G06F 17/10 (2006.01)
G06F 17/00 (2006.01)
G06F 17/11 (2006.01)
G06F 7/60 (2006.01)
G06F 7/00 (2006.01)
G06F 19/00 (2006.01)
G01R 13/00 (2006.01)
G01R 13/02 (2006.01)
G01R 15/00 (2006.01)
H01P 3/08 (2006.01)
H01P 3/00 (2006.01)
H01P 5/00 (2006.01)
H01P 5/12 (2006.01)
H01P 5/16 (2006.01)
H01P 5/18 (2006.01)

(52) U.S. Cl. .................. 703/2; 703/4; 702/57; 702/66; 702/69; 702/71; 333/116

(58) Field of Classification Search ................ 703/2, 703/4; 702/57, 66, 69, 71; 333/116
See application file for complete search history.

(56) References Cited

U.S. PATENT DOCUMENTS

| | | | |
|---|---|---|---|
| 6,801,881 B1 * | 10/2004 | Shah ............................. 703/2 |
| 7,006,931 B2 * | 2/2006 | Deutsch et al. ............... 702/57 |
| 2004/0162711 A1 | 8/2004 | Quint et al. .................... 703/4 |

(Continued)

OTHER PUBLICATIONS

Tom Dhaene, Daniel De Zutter, "Selection of Lumped Element Models for Coupled Lossy Transmission Lines", Jul. 1992, IEEE Transactions on Computer-Aided Design, vol. II. No. 7.*

(Continued)

*Primary Examiner*—Kamini S Shah
*Assistant Examiner*—Suzanne Lo
(74) *Attorney, Agent, or Firm*—Ryan, Mason & Lewis, LLP

(57) ABSTRACT

Methods and apparatus are provided for predicting the number of iterations needed for a computed Transversal Waveform Relaxation solution to achieve a given level of accuracy. In this manner, a Transversal Waveform Relaxation algorithm is disclosed that provides full automation. According to one aspect of the invention, a circuit is analyzed having transmission lines. One or more transmission line parameters of the circuit are obtained, as well as the intrinsic behavior, $E(\omega)$, and strength of coupling, $N(\omega)$, of each of the transmission lines. In addition, a relative error bound is obtained for the circuit based on the intrinsic behavior, $E(\omega)$, and strength of coupling, $N(\omega)$, of the transmission lines and a predefined error threshold. The process then iterates until the relative error bound satisfies the error threshold.

6 Claims, 3 Drawing Sheets

U.S. PATENT DOCUMENTS

2005/0091015 A1    4/2005   Adamian ........................ 703/2
2005/0096888 A1*   5/2005   Ismail ........................... 703/2

OTHER PUBLICATIONS

Nakhla et al. "Simulation of Coupled Interconnects Using Waveform Relaxation and Transverse Partitioning" IEEE Transactions on Advanced Packaging, vol. 29, No. 1, Feb. 6, 2006, pp. 78-87.*

Nakhla et al. "Simulation of Coupled Interconnects using Waveform Relaxation and Transverse Partitioning" 2004, IEEE, pp. 25-28.*

Nakhla et al , "Waveform Relaxation Techniques for Simulation of Coupled Interconnects with Frequency-Dependent Parameters," IEEE 14th Topical Meeting pp. 47-50 Oct. 2005.

Nakhla et al., "Simulation of Coupled Interconnects Using Waveform Relaxation and Transverse Partitioning," EPEP'04, vol. 13, pp. 25-28, Portland, OR, Oct. 2004.

Lelarasmee et al., "The Waveform Relaxation Method for time-domain Analysis of Large Scale Integrated Circuits", IEEE, vol. CAD-1, No. 3, Jul. 1982.

Gebele et al., "Efficient Numerical Method to Solve the Non-uniform MTL Equation Including Field Coupling", IEE Symposium on Electromagnetic Compatibility, pp. 18-22, Aug. 2003.

Tanji et al., "Passive Closed-form Expression of RLCG Transmission Lines", IEEE International Symposium on Circuits and Systems, May 2002.

* cited by examiner

METHODS AND APPARATUS FOR PREDICTING CONVERGENCE OF A TRANSVERSAL WAVEFORM RELAXATION ALGORITHM

FIELD OF THE INVENTION

The present invention relates to the analysis of electrical circuits, and more particularly, to the analysis of transmission line circuits using Transversal Waveform Relaxation techniques.

BACKGROUND OF THE INVENTION

Electrical circuits with transmission lines are typically analyzed to ensure proper functioning of the circuits. The coupling between multiple lines and the resultant coupled signals are an important aspect of these transmission line circuits. Power distribution systems, for example, often must be analyzed for stability and other properties. Similarly, in instrumentation circuits and computer circuitry in racks or cabinets the noise coupled between transmission lines needs to be understood and minimized.

A number of techniques have been proposed or suggested for analyzing multiple wire transmission lines. Such techniques are described, for example, in Clayton Paul, Analysis of Multiconductor Transmission Lines, Ch. 5 (Wiley, 1994). While these techniques are suitable for the analysis of models with a few lines, the complexity increases rapidly as the number of lines increases. Some simplified techniques have been proposed to approximate the solution for many transmission lines with only neighbor-to-neighbor wire coupling. These approaches are suitable where reduced accuracy is acceptable to gain speed.

Existing techniques for analyzing multiple wire transmission lines are limited in the number of coupled lines or wires that can be analyzed simultaneously. The complexity of the coupling calculation increases rapidly as the number of lines increases, and the accuracy of the results decreases with the increasing number of lines. Hence, the existing techniques are unable to handle a large number of lines due to excessive computation time and the results become questionable. Some prior art techniques ignore the couplings for more than two lines to speed up the process. Other techniques are based on having only linear circuits to speed up the calculation process and are therefore unsuitable for handling even typical transmission line circuits, which include surrounding nonlinear drivers and receivers.

U.S. patent application Ser. No. 10/776,716, entitled "System and Method For Efficient Analysis of Transmission Lines," incorporated by reference herein, discloses "Transversal Waveform Relaxation" techniques for analyzing multiple wire transmission lines by determining which sources influence each of a plurality of transmission lines, based on coupling factors. Transmission line parameters are computed based on the sources, which influence each transmission line. A transient or frequency response is analyzed for each transmission line by segmenting each line to perform an analysis on that line. The step of analyzing is repeated using waveforms determined in a previous iteration until convergence to a resultant waveform has occurred. For a more detailed discussion of such Transversal Waveform Relaxation techniques, see, for example, Nakhla et al., "Simulation of Coupled Interconnects Using Waveform Relaxation and Transverse Partitioning," EPEP'04, Vol 13, pp 25-28, Portland, Oreg., October 2004, incorporated by reference herein.

While such Transversal Waveform Relaxation techniques have greatly improved the analysis of multiple wire transmission lines, they suffer from a number of limitations, which if overcome, could provide further improvements. For example, the Transversal Waveform Relaxation is not fully automated and requires some manual input to determine when the algorithm has achieved a given level of accuracy. The full automation has been hampered by the absence of a quantitative link between the physical characteristics of a multiconductor transmission line system, as expressed by the per-unit-length capacitance, resistance, inductance and conductance matrices, and the convergence behavior of a Transversal Waveform Relaxation algorithm when used for the electrical analysis of large scale multiconductor transmission line systems. It has been qualitatively observed that when the electromagnetic coupling between the lines in the system is weak, the Transversal Waveform Relaxation algorithm needs only a few iterations to converge to an accurate solution.

A need therefore exists for methods and apparatus for predicting the number of iterations needed for the computed solution to achieve a given level of accuracy. A further need exists for a Transversal Waveform Relaxation algorithm that provides full automation.

SUMMARY OF THE INVENTION

Generally, methods and apparatus are provided for predicting the number of iterations needed for a computed Transversal Waveform Relaxation solution to achieve a given level of accuracy. In this manner, a Transversal Waveform Relaxation algorithm is disclosed that provides full automation. According to one aspect of the invention, a circuit is analyzed having transmission lines. One or more transmission line parameters of the circuit are obtained, as well as the intrinsic behavior, $E(\omega)$, and strength of coupling, $N(\omega)$, of each of the transmission lines. In addition, a relative error bound is obtained for the circuit based on the intrinsic behavior, $E(\omega)$, and strength of coupling, $N(\omega)$, of the transmission lines and a predefined error threshold. Thereafter, the process iterates until the relative error bound satisfies the error threshold.

The transmission line parameters of the circuit may include one or more of capacitance, resistance, inductance and conductance. The intrinsic behavior, $E(\omega)$, indicates the single line bound of each transmission line and the strength of coupling, $N(\omega)$, measures the size of the coupling terms between two or more transmission lines.

A more complete understanding of the present invention, as well as further features and advantages of the present invention, will be obtained by reference to the following detailed description and drawings.

DETAILED DESCRIPTION

The present invention provides methods and apparatus for determining a number of iterations needed for a solution computed by a Transversal Waveform Relaxation algorithm to achieve a given level of accuracy.

Figure 1:
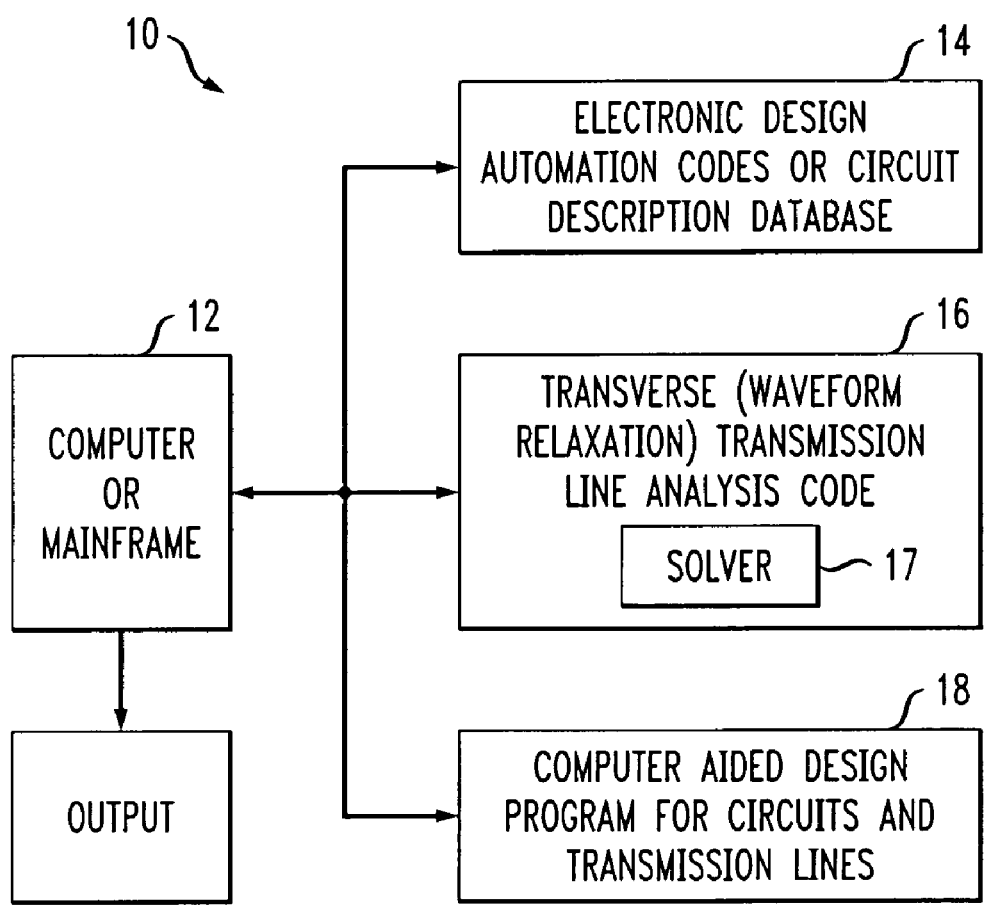
FIG. 1 is a block diagram illustrating a system in accordance with an embodiment of the present invention.

FIG. 1 is a block diagram illustrating a system 100 in which the present invention can operate. As shown in FIG. 1, an exemplary system 10 includes a computer 12, such as a personal computer or a mainframe. Computer 12 includes any interface devices known in the art. Computer 12 may include a plurality of modules or software packages that may be resident in the system or coupled thereto via a network or the like. For example, computer 12 may be provided access to electronic design automation (EDA) libraries or other circuit databases 14, which include electrical circuits or integrated circuit chip designs.

A module 16 may include one more programs or subroutines for carrying out methods in accordance with the present invention. Module 16 may include transmission line analysis programs, including a solver 17 or code to determine coupling factors, perform sliding calculations, update coupling models and perform transient analysis, among other things as will be described in greater detail herein below. Module 16 may be incorporated into other programming packages, such as full-blown circuit analysis systems or programs. In addition, as discussed further below in conjunction with FIG. 4, the module 16 includes a process 400 for determining a number of iterations needed for a solution computed by the transmission line analysis programs 200 (FIG. 2) to achieve a given level of accuracy.

A computer aided design (CAD) module or program 18 may be included to import designs or design information to the system 10 to provide the appropriate circuit analysis. CAD schematics and or EDA data from database 14 may be employed as inputs to module 16 to analyze components of a design, and preferably transmission lines in the design.

Figure 2:
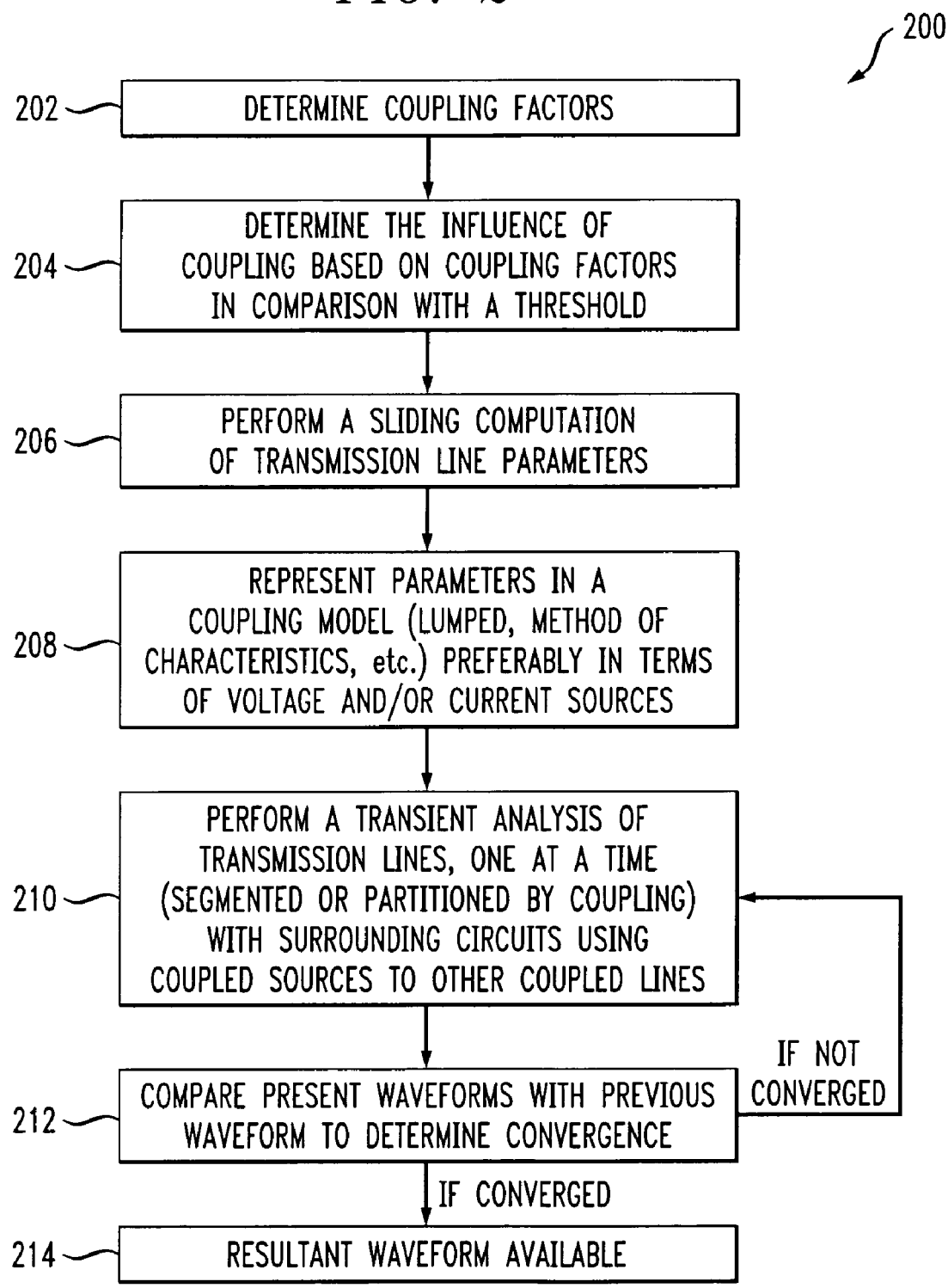
FIG. 2 is a flow diagram illustrating a method for transmission line analysis using a transverse waveform relaxation process.

FIG. 2 is a flow diagram illustrating a method 200 for transmission line analysis using a transverse waveform relaxation process. The transmission line analysis process 200 may be referred to as a transverse waveform relaxation process. In circuit designs, one or more transmission lines may be present. To handle a plurality of coupled lines, the impact of each neighboring transmission line needs to be considered. For a more detailed discussion of suitable transverse waveform relaxation processes, see, for example, U.S. patent application Ser. No. 10/776,716, entitled "System and Method For Efficient Analysis of Transmission Lines," or Nakhla et al., "Simulation of Coupled Interconnects Using Waveform Relaxation and Transverse Partitioning," EPEP'04, Vol 13, pp 25-28, Portland, Oreg., October 2004, each incorporated by reference herein.

Generally, the transversal waveform relaxation algorithm 200 initializes the electrical states of all wires; analyzes every wire at a time with couplings from all other wires implemented with known voltage and current sources; and iterates until convergence. The present invention provides techniques for determining when such convergence has occurred.

The exemplary transverse waveform relaxation process 200 shown in FIG. 2 addresses neighbor-to-neighbor coupling early on in the process. This keeps the problem sparse if the model includes a large number of coupled transmission lines. Also, a coupling model of parameters, which have to be computed at the same time, is limited to a relatively small number. The model limits the number of coupled sources needed to represent the couplings. Then, each wire is individually analyzed as a subcircuit while the coupled sources are taken into account, and the waveforms between the last two iterations are compared to check for convergence.

In block 202, coupling factors are determined for transmission lines in a given design. Coupling factors are determined by calculating the influence of neighboring lines on a given line. In one embodiment, an inductance coupling factor (cf) may be calculated as:

$$cf = \frac{L_{12}}{\sqrt{L_{11}L_{22}}}$$

where $L_{12}$ is the inductive influence of $L_2$ on $L_1$ (coupling term) and $L_{11}$ is the inductance of line 1 and $L_{22}$ is the inductance of line 2 (these may be referred to as self terms). A similar coupling factor can be calculated for resistance $$\left(cf = \frac{R_{12}}{\sqrt{R_{11}R_{22}}}\right)$$

and capacitance $$\left(cf = \frac{C_{12}}{\sqrt{C_{11}C_{22}}}\right).$$

Other coupling factors may be used and preferably dimensionless variables. Also, default values, e.g., 0.001, may be inserted into the program for coupling factors to ensure a nonzero number exists in the case where the coupling factor is not available or for other reasons.

The coupling factors are estimated first with approximate computations. This leads to the knowledge of how many transmission lines are to be included in each segment of the calculation. The segments are computed in an overlapping way such that all the interactions are taken into account so that each line can be analyzed individually taking into account the pertinent couplings for each line.

After calculating the coupling factors for transmission lines in a design, the coupling factors are compared to a threshold value(s), in block 204, to determine if they will have an influence on neighboring lines. For example, $L_{coupling} < L_{tolerance}$; $C_{coupling} < C_{tolerance}$; and $R_{coupling} < R_{tolerance}$.

The tolerance or threshold is preferably set by a designer but can also be calculated based on parameters or criteria for a given design. For example, in sensitive equipment, a smaller tolerance may be needed meaning smaller influences should be considered in analyzing transmission line parameters. Coupling factors that are determined to be too small may be disregarded in future calculations for a given segment. However, since many circuits are dynamic and different portions of a circuit may be operational at a different time, different time frames may be investigated to ensure a complete solution.

For example, for a given line, coupling factors are employed to determine the influence of other lines on the line in question. Based on these estimates, the calculations are segmented for each line to include the most influential coupling effects.

In block 206, a sliding computation is optionally performed to calculate transmission line parameters (L, C and R), for example, if all of the transmission line parameters cannot be obtained in accordance with step 202. These calculations are preferably based on geometric features. The calculation of the per-unit line parameters L, R, and C is preferably performed in a segmented way, since the simultaneous calculation of these matrix quantities is very expensive for more than a few lines. Hence, each segmented calculation will include the computation of the L, R, C parameters for a number of lines. The number of steps needed to determine these parameters is much smaller than the total number of lines since the most influential lines are considered. This simplifies the evaluation of the L, R, C parameters since each sub-problem is much smaller than the large single evaluation of each parameter.

For example, assuming 100 transmission lines, the coupling evaluation determines that 5 lines should be included near each line to accurately take the coupling into account. So for the sliding calculation, the first 15 lines are evaluated simultaneously using, for example, a standard field solver for L, R and C. This result can be used for the first 10 lines in the transverse waveform relaxation (WR) approach given herein. Then, in a next sliding field calculation, the next L, R, C, are evaluated for 15 lines from line 10 to line 25. Then, this calculation can be used to evaluate the transverse WR for lines 11 to 20, and so on. Hence, the field calculation is completed only on a subset of the lines which is much faster since the compute time of the field solver increases enormously with the number of lines considered.

In one embodiment, the characteristics of a circuit as defined in a CAD schematic are employed to make these sliding calculations. The sliding calculations provide a baseline for the transient analysis as will be described hereinafter.

Based on the sliding computation, in block 208, a coupling model or models are employed to reduce the circuit characteristics into terms of voltage and/or current sources with lumped elements (L, R, C) or alternately uses the method of characteristic models to model the circuit.

In block 210, a transient analysis/frequency domain analysis of the transmission lines is performed preferably one wire at a time. The transient analysis/frequency domain analysis is based on a transmission line response to surrounding circuits using coupled sources to other coupled lines as provided by the models set forth in block 208.

In one embodiment, partitioning along the coupling of the lines is performed. In other words, each line is taken one at a time considering the most pertinent coupling influences on that line. Alternately, partitioning over the length of the line may be performed as well or in addition to a calculation for the partitioning of the coupling of the line.

In block 212, the transient analysis of block 210 is repeated until convergence is achieved by comparing a previous value of the waveforms determined by the transient analysis from a previous iteration to the waveforms determined in the present iteration. If convergence is achieved the resultant waveforms have been determined and are available in block 214. If convergence has not yet been achieved, then the program returns to block 210 to recalculate the waveforms.

As previously indicated, the present invention provides methods discussed further below in conjunction with FIG. 4 to determine the number of iterations needed for a computed solution to achieve a given level of accuracy.

Figure 3:
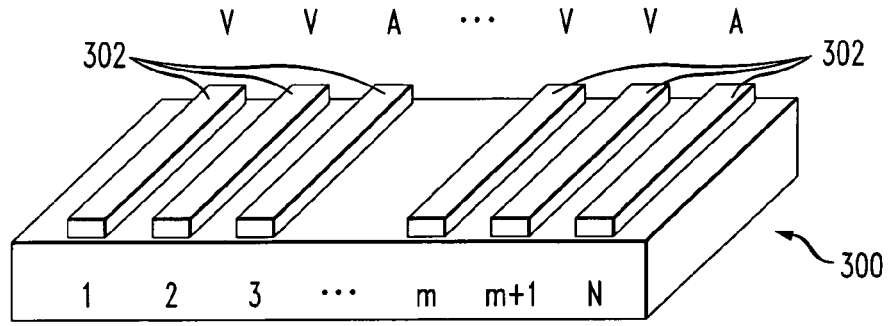
FIG. 3 depicts an illustrative geometry for a multiple transmission lines to be analyzed in accordance with the present invention.

FIG. 3 depicts an illustrative geometry 300 for a multiple transmission lines to be analyzed in accordance with the present invention. Transmission lines 302 are numbered 1 to N in the depicted section of a circuit 300. Lines 302 are marked with an A to indicate that they are aggressor lines. These lines are exited with some external circuitry. In contrast, the lines which are marked with a V are victim lines which are not excited with external sources.

Using one method, e.g., set forth with reference to FIG. 2, the subcircuits/lines of FIG. 3 are analyzed starting at line 1, in sequence, until line N is reached. This sequence is followed for each calculation in FIG. 2. Then, the sequence is repeatedly followed go until convergence in the transient/frequency analysis (e.g., blocks 210 and 212).

A more efficient method is based on signal flow. For example, initially, all coupled waveform sources are set to zero. Then, starting with the analysis of the circuits, which include the aggressors (A) first, new coupled-source quantities are available from the coupling model (block 206). Then, the nearest neighbors are analyzed since they will include the largest signals next to the aggressors. The process progresses through all the wires until all of the wires have been visited. In each step/iteration, the latest, updated waveforms are employed.

These methods are directly applicable to parallel processing for circuit problems, which include transmission lines. Each of the N transmission lines forms a separate subsystem with a transverse decoupling scheme (e.g., portioning along coupling lines or effects). Further partitioning is possible along the length of the line using conventional techniques.

Partitioning or segmenting line by line (coupling) leads to 2N subsystems which can be analyzed on separate processors where the only information that needs to be exchanged between processors is waveforms. Hence, an enormous gain in speeding up the process by parallel processing is achieved.

Convergence Criterion

As previously indicated, the present invention provides methods and apparatus for determining a number of iterations needed for a solution computed by a Transversal Waveform Relaxation algorithm to achieve a given level of accuracy. As discussed hereinafter, the present invention relates the number of iterations needed to achieve a certain level of accuracy to an error threshold. In addition, the present invention quantifies the physical intuition that the weaker the couplings between the lines, the faster the convergence.

The disclosed techniques relate the convergence properties to input data of the transmission line system, such as per-unit-length R, L, G, C matrices. An automatic stopping criterion is provided for the iterative process that allows the Transversal Waveform Relaxation software to be run by users who need not be skilled in the art.

As discussed in the following sections, the present invention is based on a transformation of the Transversal Waveform Relaxation algorithm as applied to the well-known telegrapher's equations of multiconductor transmission lines into an iterative process applied to an integral equation, referred to as a Volterra integral equation. Thereafter, formulas for the convergence rate of Transversal Waveform Relaxation and the approximation error incurred, if the iterative process is stopped, are derived. The Transversal Waveform Relaxation process 200 of FIG. 2 can then be augmented with an error threshold and the ability to compute the error as a function of the iteration number. Automatic termination is achieved when the error threshold is reached.

The Telegrapher's Equation

The set of first-order partial differential equations describing the behavior of the multiconductor transmission lines are:

$$\frac{\partial}{\partial x}v(x,t) = -Ri(x,t) - L\frac{\partial}{\partial t}i(x,t) \qquad (1)$$

$$\frac{\partial}{\partial x}i(x,t) = -Gv(x,t) - C\frac{\partial}{\partial t}v(x,t)$$

where $R, L, G, C \in \Re^{N \times N}$ are the per-unit-length (PUL) matrices of the N lines. These matrices are symmetric positive semidefinite. Each of the matrices is split between a diagonal part and non-diagonal part. The diagonal part will be denoted with $D_X$ and the nondiagonal part with $N_X$ where X refers to the original matrix as follows:

$$R = D_R + N_R \qquad (2)$$

$$L = D_L + N_L$$

$$G = D_G + N_G$$

$$C = D_C + N_C.$$

The D matrices are the self parameters of the lines while the N matrices are the coupling parameters. The following notation is used:

$$D_Z(\omega) = D_R + j\omega D_L \qquad (3)$$

$$N_Z(\omega) = N_R + j\omega N_L$$

$$D_Y(\omega) = D_G + j\omega D_C$$

$$N_Y(\omega) = N_G + j\omega N_C$$

where $j\omega$ is the Fourier variable. Using the above matrix splittings, the telegrapher's equation can be written in the time domain as $$\frac{\partial}{\partial x}v(x,t) = -D_R i(x,t) - D_L \frac{\partial}{\partial t}i(x,t) - N_R i(x,t) - N_L \frac{\partial}{\partial t}i(x,t) \qquad (4)$$

$$\frac{\partial}{\partial x}i(x,t) = -D_G v(x,t) - D_C \frac{\partial}{\partial t}v(x,t) - N_G v(x,t) - N_C \frac{\partial}{\partial t}v(x,t)$$

and in the frequency domain as $$\frac{\partial}{\partial x}V(x,\omega) = -D_Z(\omega)I(x,\omega) - N_Z(\omega)I(x,\omega) \qquad (5)$$

$$\frac{\partial}{\partial x}I(x,\omega) = -D_Y(\omega)V(x,\omega) - N_Y(\omega)V(x,\omega)$$

The above two first-order equations can be combined in a single first order equation of order 2N:

$$\frac{\partial}{\partial x}\Phi(x,\omega) = -D(\omega)\Phi(x,\omega) - N(\omega)\Phi(x,\omega) \qquad (6)$$

where:

$$\Phi(x,\omega) = \begin{bmatrix} V(x,\omega) \\ I(x,\omega) \end{bmatrix}, D(\omega) = \begin{bmatrix} O & D_Z(\omega) \\ D_Y(\omega) & O \end{bmatrix}, \qquad (7)$$

$$N(\omega) = \begin{bmatrix} O & N_Z(\omega) \\ N_Y(\omega) & O \end{bmatrix}$$

Equation 7 describes a linear system with a matrix $D(\omega)$ and an input matrix $N(\omega)$ through which the electromagnetic couplings impact the electrical states of the wires. Note that if $N(\omega)$ is the zero matrix, N independent single-line telegrapher's equations are obtained. The general solution of Equation 7 is given by $$\Phi(x,\omega) = e^{-D(\omega)x}\Phi(0,\omega) - \int_0^x e^{-D(\omega)(x-\zeta)}N(\omega)\Phi(\zeta,\omega)d\zeta \qquad (8)$$

If the initial vector $\Phi(0,\omega)$ (voltages and current at the near end ports) were known, the above equation would have been, for the variable x and at each frequency $\omega$, a Volterra integral equation of the second kind. This type of integral equations can be solved according to the Picard iteration.

$$\Phi^{(r+1)}(x,\omega) = e^{-D(\omega)x}\Phi(0,\omega) - \int_0^x e^{-D(x)(x-\zeta)}N(\omega)\Phi^{(r)}(\zeta,\omega)d\zeta. \qquad (9)$$

Note that this equation is almost identical to Equation (6) in Nahkla et al., rewritten here as $$\Phi^{(r+1)}(x,\omega) = e^{-D(\omega)x}\Phi^{(r+1)}(0,\omega) - \int_0^x e^{-D(\omega)(x-\zeta)}N(\omega)\Phi^{(r)}(\zeta,\omega)d\zeta. \qquad (10)$$

The main difference between Equation 9 and Equation 10 is in the initial-condition term where it is kept at its original value in the Picard iteration (it is a real initial condition) but is updated in the waveform relaxation, using the boundary conditions of each transmission line. The value of $\Phi(0,\omega)$ is not known a priori but depends on the near-end and far end-end terminations of the transmission line. It is noted that the most natural initial guess for starting the TWR iteration in the transmission line case is to solve for the N transmission lines using the existing terminations with no coupling, i.e., $N(\omega) = 0$. The net result of this difference between the initial-value problem in the Volterra iteration and the boundary-value problem of the telegrapher's equation is that the traditional analysis of the Picard iteration and its proof of convergence to the unique solution of the Volterra integral equation does not apply to the transmission-line case. Nonetheless, knowledge of the "initial vector" $\Phi(0,\omega)$ can be dispensed with if instead of writing the integral equation of currents and voltages as in Equation 8, the equation of the near-end/far-end transfer matrix of the multiconductor transmission lines is written.

Volterra Integral Equation for the Transfer Matrix

It is well known that this transfer matrix $T(x,\omega)$ is an exponential matrix that satisfies the ordinary matrix differential equation:

$$\frac{\partial}{\partial x}T(x,\omega) = -(D(\omega) + N(\omega))T(x,\omega) \qquad (11)$$

with the initial condition $T(x,\omega) = I$, where I is the 2N×2N identity matrix. This equation can be written as:

$$\frac{\partial}{\partial x}T(x,\omega) = -D(\omega)T(x,\omega) - N(\omega)T(x,\omega) \qquad (12)$$

where the term $N(\omega)T(x,\omega)$ is considered a forcing input. The general solution of the above equation is written as:

$$T(x,\omega) = e^{-D(\omega)x} - \int_0^x e^{-D(\omega)(x-\zeta)}N(\omega)T(\zeta,\omega)d\zeta \qquad (13)$$

This matrix integral equation is indeed a Volterra integral equation of the second kind. It can be solved using the following iterative scheme:

Picard iteration for the transfer matrix of the multiconductor transmission line is the presence of off-diagonal splitting for the PUL matrices, as follows:

1. Set $T^{(0)}(x,\omega) = e^{-D(\omega)x}$.
2. Update $$T^{(r+1)}(x,\omega) = e^{-D(\omega)x} + \int_0^x e^{-D(\omega)(x-\zeta)}(-N(\omega)T^{(r)}(\zeta,w))d\zeta \qquad (14)$$

3. Repeat (2) until convergence.

The properties of the Picard iteration are now used to derive an explicit expression for the solution of Equation 12.

First denote by $S^{(r+1)}(x,\omega) = T^{(r+1)}(x,\omega) - T^{(r)}(x,\omega)$. Then based on the Picard iteration 14:

$$S^{(r+1)}(x,\omega) = \int_0^x e^{-D(\omega)(x-\zeta)}(-N(\omega))S^{(r)}(\zeta,\omega)d\zeta \qquad (15)$$

which is the recursive equation defining all the $S^{(r)}(x,\omega)$ iterates. Taking the matrix norm of both sides, the following inequalities are obtained:

$$\|S^{(r+1)}(x,\omega)\| = \left\|\int_0^x e^{-D(\omega)(x-\zeta)}(-N(\omega))S^{(r)}(\zeta,\omega)d\zeta\right\| \qquad (16)$$

$$\leq \int_0^x \|e^{-D(\omega)(x-\zeta)}(-N(\omega))S^{(r)}(\zeta,\omega)\|d\zeta$$

$$\leq \int_0^x \|e^{-D(\omega)(x-\zeta)}\|\|(-N(\omega))\|\|S^{(r)}(\zeta,\omega)\|d\zeta$$

$$\leq \|N(\omega)\|\int_0^x \|e^{-D(\omega)(x-\zeta)}\|\|S^{(r)}(\zeta,\omega)\|d\zeta$$

Since the function $(x,\zeta) \to \to \|e^{-D(\omega)(x-\zeta)}\|$ is continuous on the square $[0,L]\times[0,L]$, where L is the length of the transmission line, it has an upper bound denoted by $E(\omega)$. Note also that $\|e^{-D(\omega)(x)}\| \leq E(\omega)$.

$$\|S^{(r)}(x,\omega)\| \leq \frac{x^r}{r!}\|N(\omega)\|^r[E(\omega)]^{r+1}, \forall x \in [0,L] \qquad (17)$$

$$\|S^{(r)}(x,\omega)\| \leq \frac{L^r}{r!}\|N(\omega)\|^r[E(\omega)]^{r+1}, \forall x \in [0,L] \qquad (18)$$

The upper bound of 18 proves that the series $$T^{(r)}(x,\omega) = \sum_{k=0}^r S^{(k)}(x,w)$$

with $S^{(0)}(x,\omega) = T^{(0)}(x,\omega)$ coverges uniformly on the interval $[0,L]$ to a limit $F(x,\omega)$. It can be shown that this matrix function is indeed the solution of the Volterra integral equation 13.

Error Analysis of the TWR Algorithm

The results of the previous section allows a rigorous error analysis of the transversal WR algorithm. As discussed hereinafter, the TWR generates the correct solution incrementally as a convergent series (every iteration one term is added to the series). The size of every term can be quantified. An upper bound on the error when the series is truncated will be derived.

When applied to multiconductor transmission lines, the residual error $R^{(n)}(x,\omega)$ after n iterations is given by $$R^{(n)}(x,\omega) = T^{(n)}(x,\omega) - \sum_{k=0}^n S^{(k)}(x,\omega) \qquad (19)$$

$$= \sum_{k=0}^\infty S^{(k)}(x,\omega)$$

$$= \sum_{k=0}^r S^{(n)}(x,\omega)$$

$$= \sum_{k=n+1}^\infty S^{(k)}(x,\omega)$$

Taking the matrix norms of both sides and using the upper bound of 18, the following (absolute) upper bound is obtained on the residual error:

$$\|R^{(n)}(x,\omega)\| \leq \sum_{k=n+1}^\infty \frac{L^k}{k!}\|N(\omega)\|^k[E(\omega)]^{k+1} \qquad (20)$$

$$= \frac{L^{n+1}}{(n+1)!}\|N(\omega)\|^{n+1}[E(\omega)]^{n+2}\sum_{k=0}^\infty \frac{L^k}{k!}\|N(\omega)\|^k[E(\omega)]^k$$

$$= \frac{L^{n+1}}{(n+1)!}\|N(\omega)\|^{n+1}[E(\omega)]^{n+2}\exp(L\|N(\omega)\|E(\omega))$$

where n is the iteration number, L is the line length, $\|N(\omega)\|$ measures the size of the coupling terms, and $E(\omega)$ indicates the (intrinsic) single line bound. These quantities from equation 20 can be computed a priori based on the input data.

The exponential in the final inequality is independent of the iteration n and is in fact an upper bound on the matrix norm $\|T(x,\omega)\|$. An estimate of the maximum relative error $\rho_n(\omega)$ of the WR approximation of the multiconductor transmission lines can be given by:

$$\rho_n(\omega) = \exp(-L\|N(\omega)\|E(\omega))\max_{x\in[0,L]}\|R^{(n)}(x,\omega)\| \qquad (21)$$

$$\leq \frac{L^{n+1}}{(n+1)!}\|N(\omega)\|^{n+1}[E(\omega)]^{n+2}$$

The matrix norm $\|N(\omega)\|$ measures the size of the coupling terms in the PUL matrices. This relative error estimate allows a prediction that the weaker the couplings the faster the convergence. Furthermore, the longer the line, the slower the convergence. These predictions are borne out by recent computational evidence.

In order to evaluate $E(\omega) = \max_{x\in[0,L]}\|\exp(-D(\omega)x)\|$, the exponential matrix $\exp(-D(\omega)x)$ must be computed, where:

$$D(\omega)\begin{bmatrix} 0 & D_Z(\omega) \\ D_Y(\omega) & 0 \end{bmatrix} = \begin{bmatrix} 0 & diag(R_{ll} + j\omega L_{ll}) \\ diag(G_{ll} + j\omega C_{ll}) & 0 \end{bmatrix} \quad (22)$$

One way to compute the matrix exponential is by using the eigenanalysis of $D(\omega)$. For is there is an invertible matrix M such the $D(\omega)=M^{-1}\Lambda(\omega)M$ then $exp(-D(\omega)x)=M^{-1} exp(-\Lambda(\omega)x)M$. Note that the square of the matrix $D(\omega)$ is diagonal:

$$D^2(\omega) = \begin{bmatrix} D_Z(\omega)D_Y(\omega) & 0 \\ 0 & D_Y(\omega)D_Z(\omega) \end{bmatrix} \quad (23)$$

$$= \begin{bmatrix} \Gamma^2(\omega) & 0 \\ 0 & \Gamma^2(\omega) \end{bmatrix}$$

where $\Gamma^2(\omega)=diag(\gamma_\parallel^2(\omega))=diag((R_\parallel+j\omega L_\parallel)(G_\parallel+j\omega C_\parallel))$.

If each $\gamma_\parallel(\omega)=\sqrt{(R_\parallel+j\omega L_\parallel)(G_\parallel+j\omega C_\parallel)}=\alpha_\parallel(\omega)+j\beta_\parallel(\omega)$ is written, where $\alpha_\parallel(\omega)$ is the attenuation constant and $\beta_\parallel(\omega)$ is the phase constant, then the spectral radius of $exp(-D(\omega)x)$ will be $max_l \, exp(\alpha_\parallel(\omega)x)$.

Figure 4:
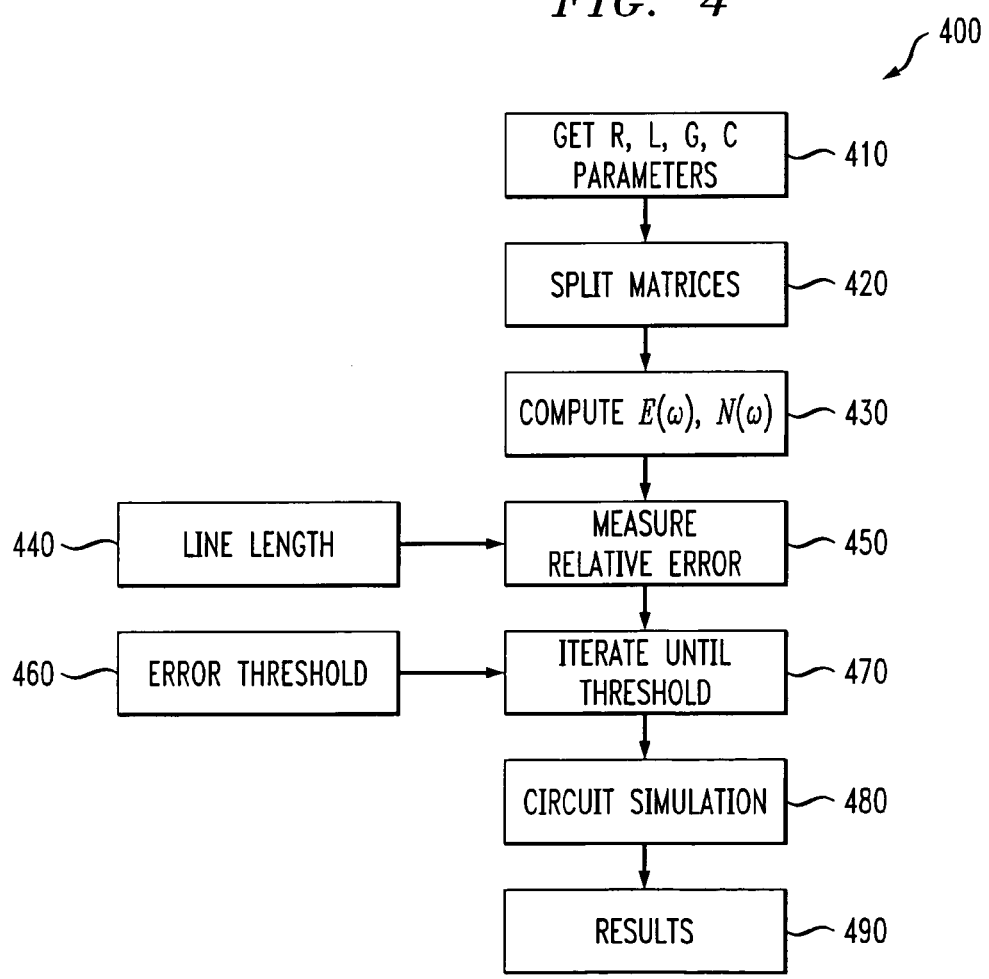
FIG. 4 is a flow chart describing an exemplary Transversal Waveform Relaxation process that incorporates a stopping criterion in accordance with the present invention.

FIG. 4 is a flow chart describing an exemplary Transversal Waveform Relaxation process 400 that incorporates a stopping criterion in accordance with the present invention. As shown in FIG. 4, the exemplary transversal waveform relaxation process 400 initially obtains the R, L, G, C parameters during step 410 for the multiconductor transmission line system under consideration. Thereafter, during step 420, the transversal waveform relaxation process 400 separates the R, L, G, C matrices into their respective diagonal and non-diagonal portions, corresponding to intrinsic and coupled characteristics, respectively.

During step 430, the transversal waveform relaxation process 400 computes the intrinsic behavior, $E(\omega)$, and strength of coupling, $N(\omega)$. The line length is obtained during step 440. The relative error is obtained during step 450 using equation (21). The error threshold is obtained during step 460, and compared during step 470 to the relative error calculated during step 450 until the threshold is reached. Once the error threshold is satisfied, the circuit simulation is generated during step 480 and the results are generated during step 490.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, , memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

What is claimed is:

1. A method for analyzing a circuit with transmission lines, comprising the following steps performed on a computer:

obtaining one or more transmission line parameters of said circuit;

obtaining intrinsic behavior, $E(\omega)$, and strength of coupling, $N(\omega)$, of each of said transmission lines, wherein $\omega$ is an operating frequency measured in radians per second;

obtaining a relative error bound for said circuit based on said intrinsic behavior, $E(\omega)$, and strength of coupling, $N(\omega)$, of said transmission lines;

obtaining a predefined error threshold;

iterating one or more of said obtaining steps until said relative error bound satisfies said error threshold, wherein said relative error bound, $\rho_n(\omega)$, is expressed as:

$$\rho_n(\omega) = exp(-L\|N(\omega)\|E(\omega))max_{x\in[0,L]} \|R^{(n)}(x,\omega)\|$$

$$\leq \frac{L^{n+1}}{(n+1)!}\|N(\omega)\|^{n+1}[E(\omega)]^{n+2}$$

where n is the iteration number and L is the line length of said transmission lines, wherein R is a residual error; and providing said relative error bound to analyze said circuit.

2. The method of claim 1, wherein said one or more transmission line parameters of said circuit comprises one or more of capacitance, resistance, inductance and conductance.

3. The method of claim 1, wherein said intrinsic behavior, $E(\omega)$, indicates the single line bound of each transmission line.

4. The method of claim 1, wherein said strength of coupling, $N(\omega)$, measures the value of the coupling terms between two or more transmission lines.

5. The method of claim 1, further comprising the step of computing coupling factors for each transmission line based on neighboring sources.

6. The method of claim 1, further comprising the step of modeling the transmission lines in terms of voltage or current sources.

* * * * *